(12) United States Patent
Doebler et al.

(10) Patent No.: US 9,006,911 B2
(45) Date of Patent: Apr. 14, 2015

(54) METHOD FOR FORMING PATTERNS OF DENSE CONDUCTOR LINES AND THEIR CONTACT PADS, AND MEMORY ARRAY HAVING DENSE CONDUCTOR LINES AND CONTACT PADS

(75) Inventors: Jonathan Doebler, Boise, ID (US); Scott Sills, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 380 days.

(21) Appl. No.: 13/472,498

(22) Filed: May 16, 2012

(65) Prior Publication Data
US 2013/0307166 A1 Nov. 21, 2013

(51) Int. Cl.
*H01L 29/40* (2006.01)
*H01L 21/768* (2006.01)

(52) U.S. Cl.
CPC ... *H01L 21/76838* (2013.01); *H01L 2924/0002* (2013.01)

(58) Field of Classification Search
None
See application file for complete search history.

(56) References Cited

U.S. PATENT DOCUMENTS

| 2006/0046201 | A1* | 3/2006 | Sandhu et al. ............... 430/314 |
| 2007/0238308 | A1* | 10/2007 | Niroomand et al. .......... 438/743 |
| 2008/0057692 | A1 | 3/2008 | Wells et al. |
| 2010/0173492 | A1* | 7/2010 | Kim et al. ..................... 438/689 |
| 2010/0244269 | A1 | 9/2010 | Kim |

OTHER PUBLICATIONS

"Office Action of Taiwan Counterpart Application", issued on Oct. 28, 2014, p. 1-p. 9, in which the listed references were cited.

* cited by examiner

*Primary Examiner* — Kyoung Lee
(74) *Attorney, Agent, or Firm* — Jianq Chyun IP Office (57) ABSTRACT

A method for forming patterns of dense conductor lines and their contact pads is described. Parallel base line patterns are formed over a substrate. Each of the base line patterns is trimmed. Derivative line patterns and derivative transverse patterns are formed as spaces on the sidewalls of the trimmed base line patterns, wherein the derivative transverse patterns are formed between the ends of the derivative line patterns and adjacent to the ends of the trimmed base line patterns. The trimmed base line patterns are removed. At least end portions of the derivative line patterns are removed, such that the derivative line patterns are separated from each other and all or portions of the derivative transverse patterns become patterns of contact pads each connected with a derivative line pattern.

18 Claims, 5 Drawing Sheets

METHOD FOR FORMING PATTERNS OF DENSE CONDUCTOR LINES AND THEIR CONTACT PADS, AND MEMORY ARRAY HAVING DENSE CONDUCTOR LINES AND CONTACT PADS

BACKGROUND OF THE INVENTION

1. Field of Invention

This invention relates to integrated circuit (IC) fabrication, and particularly to a method for forming patterns of dense conductor lines and their contact pads, and to a memory array having high density of conductor lines and contact pads.

2. Description of Related Art

The resolution in a photolithography process depends on the wavelength of the exposure light, the numerical aperture (NA) of the optical system and the design of the photomask, and has a limit of about ⅕ to ⅓ of the wavelength of the exposure light according to the exposure conditions. When the resolution required by an array of patterns exceeds the resolution of the lithographic system, for example, in a case of forming the gate line array of a high-density memory like a DRAM of next generation, a pitch reduction method is needed, mainly based on the spacer forming technique.

For example, patterns of dense conductor lines beyond lithographic resolution can be formed as follows. Parallel base line patterns are lithographically defined and trimmed, linear spacers having a smaller width/pitch and a double number are formed on the sidewalls of the base line patterns, and then the base line patterns are removed, leaving the linear spacers as the target line patterns beyond the lithographic resolution.

To lithographically define contact pads at the ends of the small-pitch conductor lines, a so-called "shark-jaw" layout is conventionally used for the line ends, wherein the line ends of each pair of neighboring lines form a "loop" that is shifted from each neighboring loop and is large in length and width to provide sufficient spaces for the formation of the respective contact pads of the respective conductor lines. Each loop is then opened by etching to separate the corresponding two neighboring lines, and then contact pads are formed around the end portions of the opened loops.

However, the shark jaw layout takes much lateral area so that the integration degree of the devices is adversely affected. Moreover, definition of the contact pads requires an additional lithography process.

SUMMARY OF THE INVENTION

Accordingly, this invention provides a method for forming patterns of dense conductor lines and their contact pads. The method is particularly suitably used to form dense conductor lines beyond the lithographic resolution and their contact pads.

This invention also provides a memory cell array having dense isolated conductor lines and contact pads, which can be formed with the method for forming patterns of dense conductor lines and their contact pads of this invention.

This invention further provides a DRAM memory chip including a plurality of memory cell arrays, each of which has dense isolated conductor lines and contact pads and can be formed with the method of this invention.

The method for forming patterns of dense conductor lines and their contact pads of this invention is described as follows. A plurality of parallel base line patterns are formed over a substrate. Each of the base line patterns is trimmed. A plurality of derivative line patterns and a plurality of derivative transverse patterns are formed as spacers on the sidewalls of the base line patterns, wherein the derivative transverse patterns are formed between the ends of the derivative line patterns and adjacent to the ends of the base line patterns. The base line patterns are removed. At least a plurality of end portions of the derivative line patterns are removed, such that the derivative line patterns are separated from each other and at least portions of the derivative transverse patterns become patterns of contact pads each connected with a derivative line pattern. The shape and layout of the line ends of the base line pattern are specifically tailored to minimize the area required to provide reliable electrical contact to each line, while maintaining electrical isolation from each other. Thus, the baseline patterns and associated chop patterns embodied herein enable improvements to the die-space efficiency of the memory chip.

In some embodiments, the patterns of the remaining portions of the derivative line patterns and transverse patterns are transferred to an underlying conductive layer to form conductor lines and their contact pads. In other embodiments, the remaining portions of the derivative line patterns and transverse patterns are directly conductor lines and their contact pads.

In an embodiment, the base line patterns are separated from each other so that the derivative line patterns are arranged in a plurality of separate pairs each including two derivative line patterns connected by two derivative transverse patterns. In other embodiments, a plurality of base transverse patterns is formed together with the base line patterns between the ends of the base line patterns.

By using the derivative line patterns to form patterns of dense conductor lines and simultaneously using the derivative transverse patterns formed between the ends of the derivative line patterns and adjacent to the ends of the trimmed base line patterns to form patterns of contact pads, dense conductor lines beyond the lithographic resolution and their contact pads can be defined simultaneously in a simple way that minimizes area requirements and maximizes die-size efficiency.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention.

FIGS. 1A-1D illustrate, in a top view, a method for forming patterns of dense conductor lines and their contact pads according to the first embodiment of this invention.

Figures 1A, 1B:
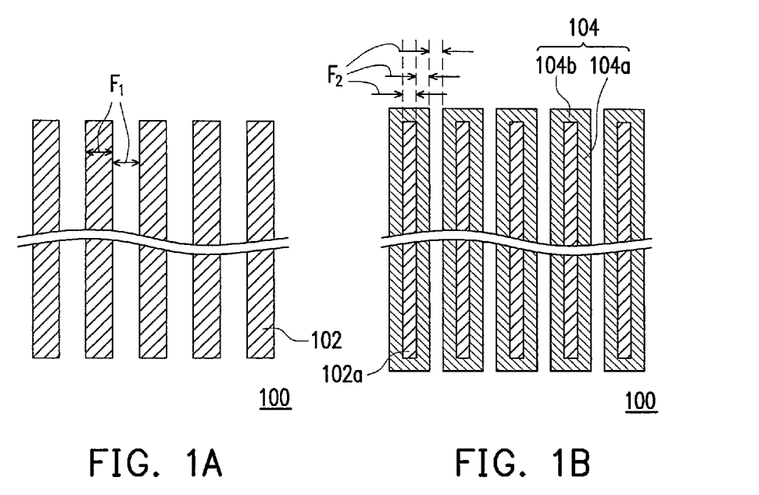
FIGS. 1A-1D illustrate, in a top view, a method for forming patterns of dense conductor lines and their contact pads according to a $1^{st}$ embodiment of this invention.

Referring to FIG. 1A, a plurality of parallel base line patterns 102 are defined lithographically over a substrate 100, possibly having a feature size of $F_1$ and a pitch of $2F_1$. The substrate 100 may have thereon a conductive layer to be patterned into dense conductor lines and their contact pads, or may alternatively have thereon an underlying layer for the conductor lines and their contact pads that are formed later as portions of the derivative line patterns and derivative transverse patterns. The feature size $F_1$ can be the lithography-limit feature size so that the derivative line patterns formed later can have a maximal density. The base line patterns 102 may include a photoresist material of positive or negative type, or alternatively include other material that can be trimmed narrowed, such as a suitable hard mask material, e.g., $SiO_x$, $Si_3N_4$, carbon or poly-Si, etc.

Referring to FIG. 1B, each of the base line patterns 102 is trimmed to a narrower base line pattern 102a having a feature size $F_2$, which may be one half of the feature size $F_1$ of each original base line pattern 102. When the base line patterns 102 include a photoresist material, the trimming may utilize a solvent, such as cyclohexanone or PGMEA. Alternatively, the photoresist trimming may be accomplished with plasma etching, using methods known to those of ordinary skill in the art.

Then, ring-shaped spacers 104 are formed on the sidewalls of the trimmed base line patterns 102a, each including two derivative line patterns 104a and two derivative transverse patterns 104b between them. The spacers 104 are usually formed by depositing a substantially conformal material layer over the substrate 100 and then anisotropically etching the same, wherein the width of each spacer 104 or derivative line pattern 104a is controlled by the deposition thickness. Since the base line patterns 102 are separated from each other, the derivative line patterns 104a are arranged in a plurality of separate pairs each including two derivative line patterns 104a connected by two derivative transverse patterns 104b.

The spacers 104 may include a conductive material, such as TiN, when the conductor lines and their contact pads are to be formed directly as portions of the derivative line patterns 104a and the derivative transverse patterns 104b. The spacers 104 may alternatively include $SiO_2$ or $Si_3N_4$ when the conductor lines and their contact pads are to be defined using portions of the derivative line patterns 104a and the derivative transverse patterns 104b as a mask.

When the original base line patterns 102 have a line/space (L/S) width of $F_1/F_1$, each trimmed base line pattern 102a has a feature size $F_2$, each derivative line pattern 104a also has a feature size of $F_2$ and $F_2=0.5\,F_1$, the derivative line patterns 104a have a constant pitch of $2F_2$ ($=F_1$). In an embodiment, $F_1$ is the lithography-limit feature size, $F_2=0.5\,F_1$, the original base line patterns 102 have an L/S width of $F_1/F_1$ substantially, the trimmed base line patterns 102a have an L/S width of $F_2/3F_2$ substantially, the derivative line patterns 104a have an L/S width of $F_2/F_2$ substantially, so that a maximal density of the derivative line patterns 104a with a constant pitch of $2F_2$ are formed, as shown in FIG. 1B.

Figure 1C:
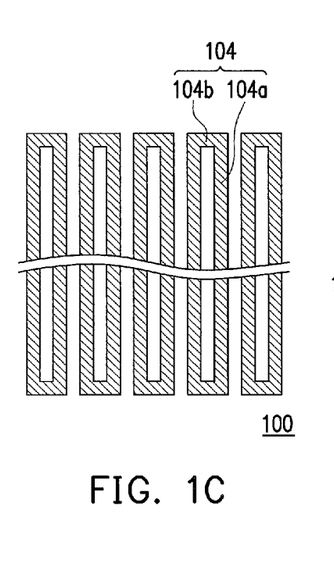

Referring to FIG. 1C, the trimmed base line patterns 102 are removed, possibly by using $O_2$-plasma ashing or solvent stripping, leaving the derivative line patterns 104a and the derivative transverse patterns 104b. For example, when the base line patterns 102 include a positive or negative photoresist material and the spacers 104 include low-temperature oxide (LTO), oxygen plasma can be used to remove the trimmed base line patterns 102.

Figure 1D:
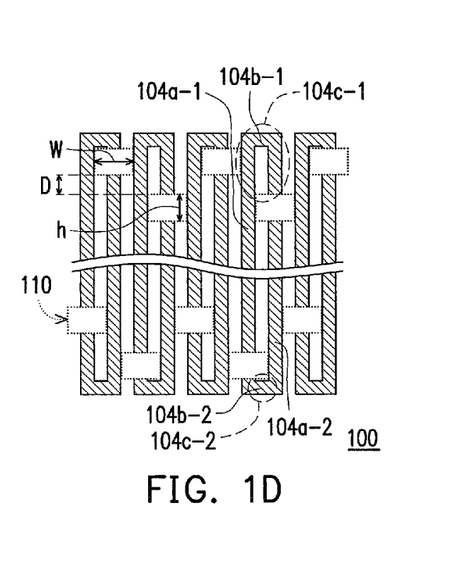

Referring to FIG. 1D, a portion of each derivative line pattern 104a is removed to disconnect the derivative line pattern 104a from the neighboring derivative line pattern 104a connected thereto and to make each derivative transverse pattern 104b become a part of a contact pad pattern. The removed portion of each derivative line patterns 104a is defined by a chop opening 110 in a mask layer that may be a photoresist layer. The chop openings 110 are arranged at the first ends and the second ends of the derivative line patterns 104a alternately, wherein the chop openings 110 arranged at the first or second ends of the derivative line patterns 104a have a staggered arrangement for higher misalignment tolerance. The chop pattern 110 is illustrated as one example, specific to the base line pattern 102. In other embodied base pattern layouts, the chop pattern may be modified to provide the maximum overlay margin for patterning of the contact pads.

The width W of each chop opening 110 may be $3F_2$ if $F_1$ ($2F_2$) is the lithography-limit feature size, due to the photoresist behavior over a grating surface. The length h of each chop opening 110 and the line-direction distance D between two neighboring chop openings 110 are adjusted for lithography need, balanced with die-size constraints.

In addition, around one end of each derivative line pattern 104a, a portion of the derivative line pattern 104a and a derivative transverse pattern 104b (and a portion of the neighboring derivative line pattern 104a connected thereto) constitute a contact pad 104c. With the staggered arrangement of the chop openings 110 as shown, in each pair of originally connected derivative line patterns 104a, an end portion of one derivative line pattern 104a-1, one derivative transverse pattern 104b-1 and an end portion of the other derivative line patterns 104a-2 constitute a larger contact pad 104c-1 having a feature size of about $4F_2$, and the other derivative line patterns 104a-2 and the other derivative transverse pattern 104b-2 constitute a smaller contact pad 104c-2 having a feature size of about $2F_2$.

Thereafter, if the remaining portions of the derivative line patterns 104a and the derivative transverse patterns 104b are not directly conductor lines and their contact pads, they are used as a mask to define the underlying conductive layer previously formed on the substrate 100 into dense conductor lines and their contact pads. The dense conductor lines thus formed may be conductor lines of a memory cell array, such as word lines of a memory cell array. The memory cell array may be one of a plurality of memory cell arrays on a DRAM memory chip.

Though the base line patterns are formed separate from each other in the above embodiment, each base line pattern may alternatively be formed with a base transverse pattern at one end thereof or with two base transverse patterns at both ends thereof, as described in the following $2^{nd}$ to $4^{th}$ and subsequent embodiments of this invention and illustrated in FIGS. 2A, 3A, 4A and 5A-5J. Such different base pattern layouts are for forming different arrangements of contact pads or for increasing the distance between the contact pads. The base transverse patterns of neighboring base line patterns may be merged. Since the materials and processing of the respective layers in the following embodiments are similar to those in the first embodiment, they are not described again.

Figure 2A:
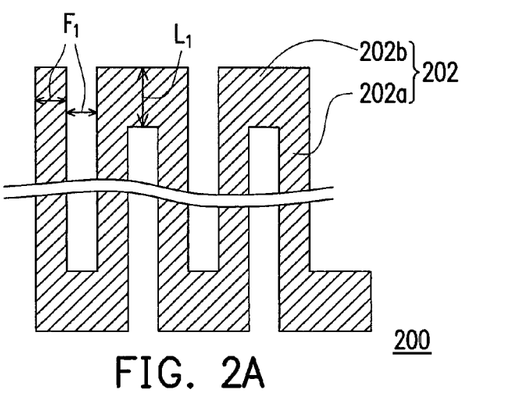
FIGS. 2A-2C illustrate, in a top view, a method for forming patterns of dense conductor lines and their contact pads according to a $2^{nd}$ embodiment of this invention.
Figure 2B:
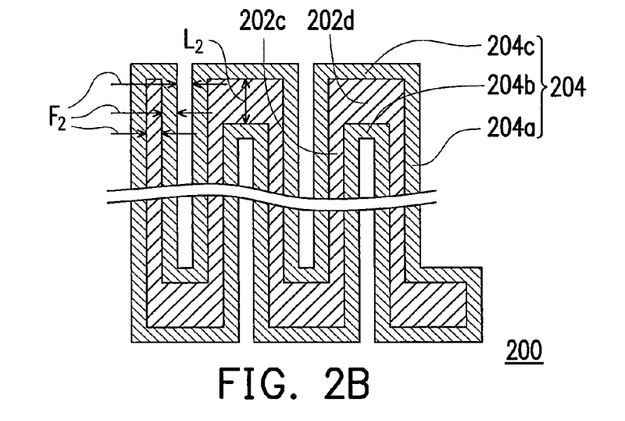
Figure 2C:
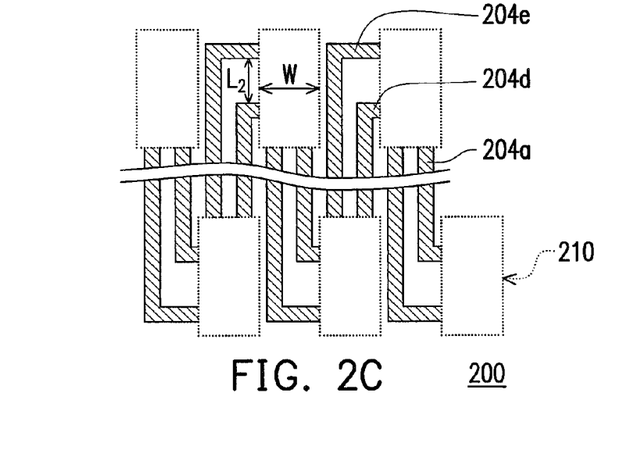

FIGS. 2A-2C illustrate, in a top view, a method for forming patterns of dense conductor lines and their contact pads according to the $2^{nd}$ embodiment of this invention.

Referring to FIG. 2A, a plurality of parallel base line patterns 202a with a feature size of $F_1$ and a constant pitch of $2F_1$ are formed over a substrate 200, together with a plurality of base transverse patterns 202b between their ends. The base line patterns 202a and the transverse patterns 202b are arranged in a serpent-shaped structure 202.

Referring to FIG. 2B, after the base line patterns 202a and the base transverse patterns 202b are trimmed into narrower base line patterns 202c with a smaller feature size of $F_2$ and narrower base transverse patterns 202d, spacers 204 are formed on the sidewalls of the same, including a plurality of derivative line patterns 204a with a feature size of $F_2$, a plurality of inner derivative transverse patterns 204b each transverse between two neighboring derivative line patterns 204a, and a plurality of outer derivative transverse patterns 204c each transverse between two derivative line patterns 204a separated by two other derivative line patterns 204a.

Referring to FIG. 2C, after the trimmed base line patterns 202c and the trimmed base transverse patterns 202d are removed, a plurality of end portions of the derivative line patterns 204a, portions of the inner derivative transverse patterns 204b, and portions of the outer derivative transverse patterns 204c are removed to separate the derivative line patterns 204a from each other and form contact pad patterns. Each of the remaining inner derivative transverse patterns 204d and the remaining outer derivative transverse patterns 204e, in combination with an end portion of the corresponding derivative line pattern 204a, constitutes a contact pad pattern.

The removed portions of 204a, 204b and 204c are defined by a plurality of chop openings 210. Each chop 210 opening covers the first or second end portions of a pair of neighboring derivative line patterns 204a, and the chop openings 210 are arranged at the first ends and the second ends of the derivative line patterns 204a alternately. The width W of each chop opening 210 is properly about $4F_2$, and the distance $L_2$ between two neighboring contact pad patterns depends on the setting of the length $L_1$ (FIG. 2A) of the original base transverse patterns 202b.

Figure 3A:
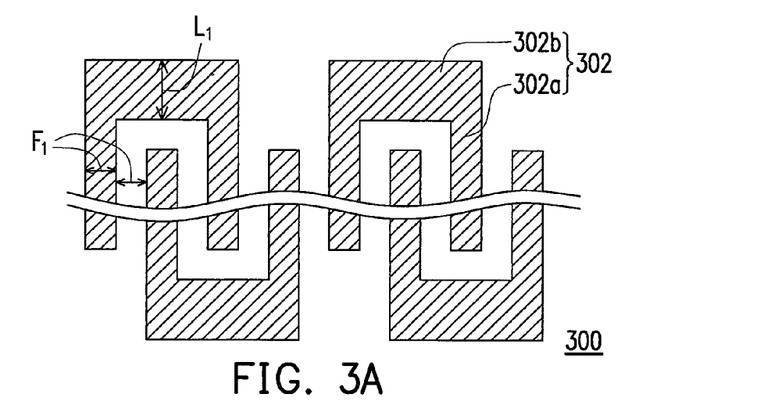
FIGS. 3A-3C illustrate, in a top view, a method for forming patterns of dense conductor lines and their contact pads according to a $3^{rd}$ embodiment of this invention.
Figure 3B:
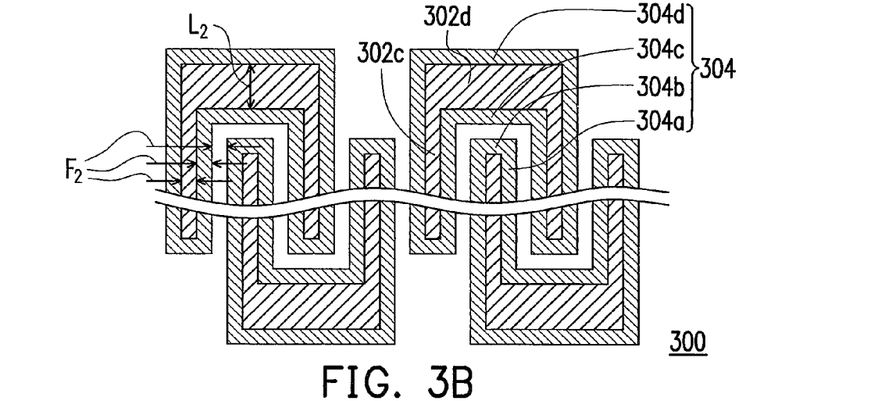
Figure 3C:
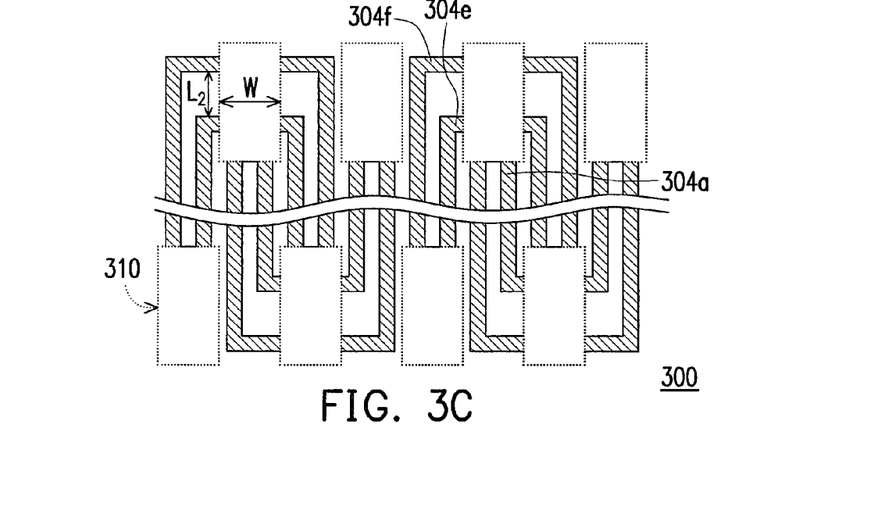

FIGS. 3A-3C illustrate, in a top view, a method for forming patterns of dense conductor lines and their contact pads according to the $3^{rd}$ embodiment of this invention.

Referring to FIG. 3A, a plurality of parallel base line patterns 302a having a feature size of $F_1$ and a constant pitch of $2F_1$ are formed over a substrate 300, together with a plurality of base transverse patterns 302b between the ends thereof. The base line patterns 302a and the base transverse patterns 302b are arranged in a series of pairs of interdigitated fork structures 302.

Referring to FIG. 3B, after the base line patterns 302a and the base transverse patterns 302b are trimmed into narrower base line patterns 302c with a smaller feature size of $F_2$ and narrower base transverse patterns 302d, spacers 304 are formed on the sidewalls of the same, including a plurality of derivative line patterns 304a with a feature size of $F_2$, a plurality of first derivative transverse patterns 304b each connecting between two neighboring derivative line patterns 304a, a plurality of second derivative transverse patterns 304c each connecting between two derivative line patterns 304a separated by two other derivative line patterns 304a, and a plurality of third derivative transverse patterns 304d each connecting two derivative line patterns 304a separated by four other derivative line patterns 304a.

Referring to FIG. 3C, after the trimmed base line patterns 302c and the trimmed base transverse patterns 302d are removed, a plurality of end portions of the derivative line patterns 304a, the first derivative transverse patterns 304b, portions of the second derivative transverse patterns 304c, and portions of the third derivative transverse patterns 304d are removed to separate the derivative line patterns 304a from each other and form contact pad patterns. Each of the remaining second derivative transverse patterns 304e and the remaining $3^{rd}$ derivative transverse patterns 304f, in combination with an end portion of the corresponding derivative line pattern 304a, constitutes a contact pad pattern.

The removed portions of 304a, 304b, 304c and 304d are defined by a plurality of chop openings 310. Each chop 310 opening covers the first or second end portions of a pair of neighboring derivative line patterns 304a, and the chop openings 310 are arranged at the first ends and the second ends of the derivative line patterns 304a alternately. The width W of each chop opening 310 is properly about $4F_2$, and the distance $L_2$ between two neighboring contact pad patterns depends on the setting of the length $L_1$ (FIG. 3A) of the original base transverse patterns 302b.

Figure 4A:
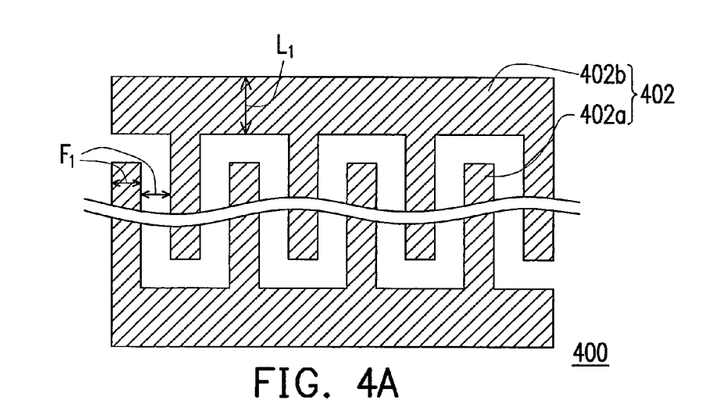
FIGS. 4A-4C illustrate, in a top view, a method for forming patterns of dense conductor lines and their contact pads according to a $4^{th}$ embodiment of this invention.
Figure 4B:
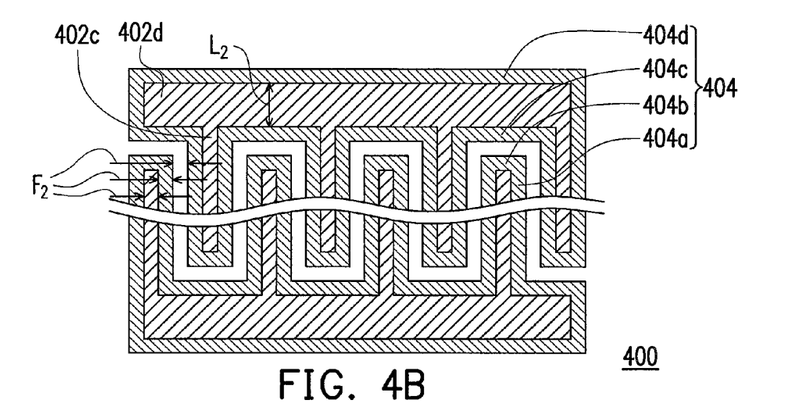
Figure 4C:
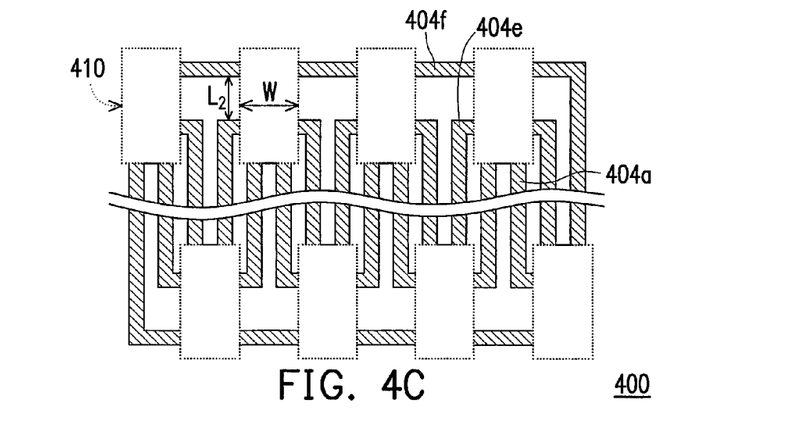

FIGS. 4A-4C illustrate, in a top view, a method for forming patterns of dense conductor lines and their contact pads according to the $4^{th}$ embodiment of this invention.

Referring to FIG. 4A, a plurality of parallel base line patterns 402a having a feature size of $F_1$ and a constant pitch of $2F_1$ are formed over a substrate 400, together with a plurality of base transverse patterns 402b between the ends thereof. The base line patterns 402a and the base transverse patterns 402b are arranged in two opposite comb-shaped structures 402 in this embodiment.

Referring to FIG. 4B, after the base line patterns 402a and the base transverse patterns 402b are trimmed into narrower base line patterns 402c with a smaller feature size of $F_2$ and narrower base transverse patterns 402d, spacers 404 are formed on the sidewalls of the same, including a plurality of derivative line patterns 404a with a feature size of $F_2$, a plurality of first derivative transverse patterns 404b each connecting between two neighboring derivative line patterns 404a, a plurality of second derivative transverse patterns 404c each connecting between two derivative line patterns 404a separated by two other derivative line patterns 404a, and two third derivative transverse patterns 404d each extending along the entire backbone of a comb-shaped structure 402.

Referring to FIG. 4C, after the trimmed base line patterns 402c and the trimmed transverse patterns 402d are removed, a plurality of end portions of the derivative line patterns 404a, the first derivative transverse patterns 404b, portions of the second derivative transverse patterns 404c, and portions of the third derivative transverse patterns 404d are removed to separate the derivative line patterns 404a from each other and form contact pad patterns. Each of the remaining second derivative transverse patterns 404e, in combination with an end portion of the corresponding derivative line pattern 404a, constitutes a contact pad pattern. The remaining portions 404f of the third derivative transverse patterns 404d may be used for other purpose, or may remain as non-functional features. Alternatively, there is no such portion 404f of the third derivative transverse patterns 404d remaining if the chop mask is designed to open the corresponding areas.

The removed portions of 404a, 404b, 404c and 404d are defined by a plurality of chop openings 410. Each chop opening 410 covers the first or second end portions of a pair of neighboring derivative line patterns 404a, and the chop openings 410 are arranged at the first ends and the second ends of the derivative line patterns 404a alternately. The width W of each opening 410 is properly about $4F_2$, and the distance $L_2$ between a contact pad pattern including a remaining second derivative transverse pattern 404e and the neighboring remaining third transverse pattern 404f depends on the setting of the length $L_1$ (FIG. 4A) of the original base transverse patterns 402b.

FIGS. 5A-5J illustrate, in a top view, ten more base pattern layouts with base transverse patterns according to other embodiments of this invention.

Figure 5A:
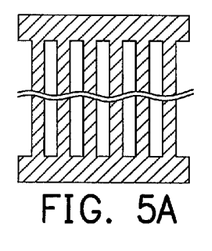
FIGS. 5A-5J illustrate, in a top view, ten more base pattern layouts with base transverse patterns according to other embodiments of this invention.

Referring to FIG. 5A, the base pattern layout has a structure of a plurality of columns between two strips of connected base transverse patterns.

Figure 5B:
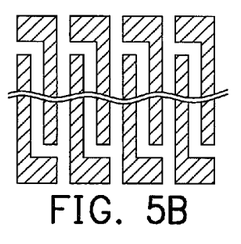

Referring to FIG. 5B, the base pattern layout includes L-shaped patterns and 180°-rotated L-shaped patterns that are arranged alternately, wherein each (180°-rotated) L-shaped pattern includes a base line pattern and a base transverse pattern at its one end.

Figure 5C:
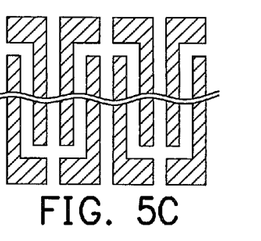

Referring to FIG. 5C, the base pattern layout includes a plurality of sets of patterns, wherein each set includes a pair of an L-shaped pattern and a 180°-rotated L-shaped pattern, and a mirrored pattern of the pair, wherein each (180°-rotated) L-shaped pattern includes a base line pattern and a base transverse pattern at its one end.

Figure 5D:
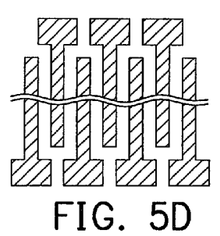

Referring to FIG. 5D, the base pattern layout includes 1-tiered T-shaped patterns, or T-shaped patterns and inverse-T-shaped patterns that are arranged alternately, wherein each T-shaped pattern or inverse-T-shaped pattern includes a base line pattern and a base transverse pattern at its one end.

Figure 5E:
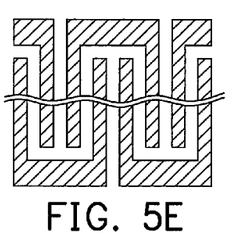

Referring to FIG. 5E, the base pattern layout includes a series of interdigitated fork patterns, wherein any two neighboring fork patterns interdigitate with each other.

Figure 5F:
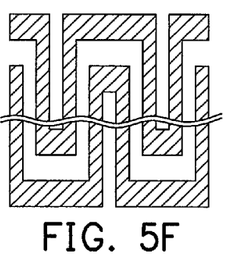

Referring to FIG. 5F, the base pattern layout includes double serpent-shaped patterns.

Figure 5G:
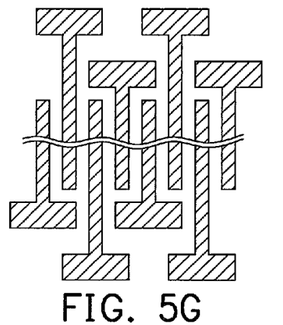

Referring to FIG. 5G, the base pattern layout includes 2-tiered T-shaped patterns, wherein T-shaped patterns and inverse-T-shaped patterns are arranged alternately. Among the T-shaped patterns or the inverse-T-shaped patterns, longer ones and shorter ones are arranged alternately.

Figure 5H:
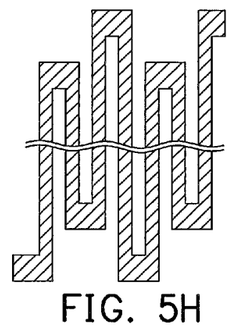

Referring to FIG. 5H, the base pattern layout includes a 2-tiered serpent-shaped pattern.

Figure 5I:
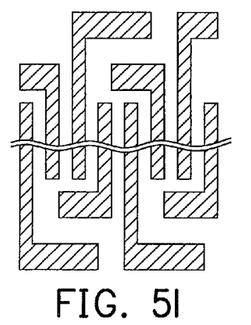

Referring to FIG. 5I, the base pattern layout includes 2-tiered L-shaped patterns wherein each L-shaped pattern includes a base line pattern and a base transverse pattern at its one end.

Figure 5J:
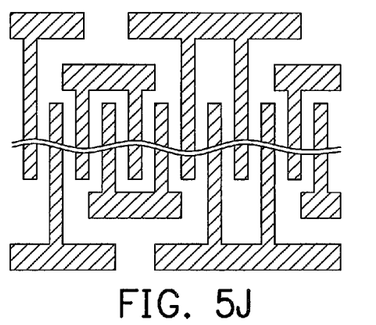

Referring to FIG. 5J, the base pattern layout includes 2-tiered interdigitated π-shaped patterns, wherein π-shaped patterns and inverse-π-shaped patterns are arranged alternately in an interdigitated manner. Among the π-shaped patterns or the inverse-π-shaped patterns, longer ones and shorter ones are arranged alternately.

Accordingly, by using the derivative transverse patterns formed between the ends of the derivative line patterns and adjacent to the ends of the trimmed base line patterns to form contact pad patterns, the contact pad patterns for dense conductor lines beyond the lithographic resolution can be formed simultaneously with the patterns of the dense conductor lines in a simple way.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for forming patterns of dense conductor lines and their contact pads, comprising:
   forming over a substrate a plurality of parallel base line patterns;
   trimming each of the base line patterns;
   forming, as spacers on side walls of the trimmed base line patterns, a plurality of derivative line patterns, and a plurality of derivative transverse patterns at ends of the derivative line patterns and adjacent to ends of the trimmed base line patterns;
   removing the trimmed base line patterns; and
   removing at least a plurality of end portions of the derivative line patterns, such that the derivative line patterns are separated from each other and all or portions of the derivative transverse patterns become patterns of contact pads each connected with a derivative line pattern.

2. The method of claim 1, further comprising transferring patterns of remaining portions of the derivative line patterns and the derivative transverse patterns to an underlying conductive layer.

3. The method of claim 1, wherein remaining portions of the derivative line patterns and the derivative transverse patterns are conductor lines and their contact pads.

4. The method of claim 1, wherein the base line patterns comprises a photoresist material.

5. The method of claim 1, wherein the base line patterns are separated from each other so that the derivative line patterns are arranged in a plurality of separate pairs each including two derivative line patterns connected by two derivative transverse patterns.

6. The method of claim 5, wherein only an end portion of each of the derivative line patterns is removed in the step of removing at least the plurality of end portions of the derivative line patterns.

7. The method of claim 6, wherein
   each of the derivative line patterns has a first end and a second end,
   the removed end portion of each derivative line pattern is defined by a chop opening arranged at the first or second end of the derivative line pattern,
   the chop openings are arranged at the first ends and the second ends of the derivative line patterns alternately, and
   the chop openings arranged at the first or second ends of the derivative line patterns have a staggered arrangement.

8. The method of claim 1, further comprising forming a plurality of base transverse patterns simultaneously with the base line patterns at ends of the base line patterns, wherein the base transverse patterns are also trimmed when the base line patterns are trimmed, and the base transverse patterns are also removed when the base line patterns are removed.

9. The method of claim 8, wherein the base transverse patterns at the ends of at least two neighboring base line patterns are merged.

10. The method of claim 8, wherein an end portion of each of the derivative line patterns and portions of the derivative transverse patterns are removed in the step of removing at least the plurality of end portions of the derivative line patterns.

11. The method of claim 8, wherein
   each of the derivative line patterns has a first end and a second end,
   the removed end portions of the derivative line patterns and the removed portions of the derivative transverse patterns are defined by a plurality of chop openings in a mask layer,
   each chop opening covers the first or second end portions of a pair of neighboring derivative line patterns, and
   the chop openings are arranged at the first ends and the second ends of the derivative line patterns alternately.

12. The method of claim 8, wherein the base line patterns and the base transverse patterns are arranged in a serpent-shaped structure.

13. The method of claim 8, wherein the base line patterns and the base transverse patterns are arranged in a series of pairs of interdigitated fork-shaped structures.

14. The method of claim 8, wherein the base line patterns and the base transverse patterns are arranged in two opposite comb-shaped structures.

15. The method of claim 1, wherein the base line patterns as formed have a line/space (L/S) width of $F_1/F_1$ substantially, the trimmed base line patterns have an L/S width of $F_2/3\,F_2$ ($F_2=0.5\,F_1$) substantially, and the derivative line patterns have an L/S width of $F_2/F_2$ substantially.

16. The method of claim 15, wherein $F_1$ is a lithography-limit feature size.

17. A memory cell array having dense isolated conductor lines and contact pads, formed with the method of claim 1.

18. A DRAM memory chip comprising a plurality of memory cell arrays, each having dense isolated conductor lines and contact pads and being formed with the method of claim 1.

* * * * *